United States Patent
Imperinetti et al.

(10) Patent No.: US 9,482,581 B2
(45) Date of Patent: Nov. 1, 2016

(54) BOLOMETRIC DETECTOR WITH A COMPENSATION BOLOMETER HAVING AN ENHANCED THERMALIZATION

(71) Applicant: COMMISSARIAT A L'ENERGIE ATOMIQUE ET AUX ENERGIES ALTERNATIVES, Paris (FR)

(72) Inventors: Pierre Imperinetti, Seyssins (FR); Agnès Arnaud, Saint Jean le Vieux (FR); Emmanuel Rolland, Jarrie (FR)

(73) Assignee: Commissariat a l'Energie Atomique et aux Energies Alternatives (FR)

( * ) Notice: Subject to any disclaimer, the term of this patent is extended or adjusted under 35 U.S.C. 154(b) by 0 days.

(21) Appl. No.: 14/460,756

(22) Filed: Aug. 15, 2014

(65) Prior Publication Data

US 2015/0053858 A1 Feb. 26, 2015

(30) Foreign Application Priority Data

Aug. 22, 2013 (FR) ..................... 13 58128

(51) Int. Cl.
*G01J 5/00* (2006.01)
*G01J 5/02* (2006.01)
*G01J 5/20* (2006.01)
*G01J 5/24* (2006.01)
(Continued)

(52) U.S. Cl.
CPC ................ *G01J 5/0285* (2013.01); *G01J 5/20* (2013.01); *G01J 5/24* (2013.01); *H05K 3/0094* (2013.01); *H05K 3/02* (2013.01); *Y10T 29/49165* (2015.01)

(58) Field of Classification Search
CPC ............ G01J 5/20; G01J 5/24; G01J 5/0285; G01J 5/0831; H05K 3/0094; H05K 3/02

USPC ....................................... 250/338.1
See application file for complete search history.

(56) References Cited

U.S. PATENT DOCUMENTS

| | | | | |
|---|---|---|---|---|
| 6,329,649 B1 * | 12/2001 | Jack | .......................... | G01J 5/20 250/250 |
| 6,329,655 B1 * | 12/2001 | Jack | .......................... | G01J 5/02 250/338.1 |
| 7,884,329 B2 * | 2/2011 | Huppertz | .................. | G01J 5/22 250/332 |

(Continued)

FOREIGN PATENT DOCUMENTS

EP 1637854 A2 3/2006

*Primary Examiner* — David J Makiya
*Assistant Examiner* — Taeho Jo
(74) *Attorney, Agent, or Firm* — St. Onge Steward Johnston & Reens LLC

(57) ABSTRACT

A bolometric detector includes a substrate; bolometric detection microbridges suspended above the substrate and thermally insulated from the substrate; bolometric compensation microbridges suspended above the substrate and thermalized to the substrate; and a read circuit formed in the substrate to apply a biasing to the detection microbridges and to the compensation microbridges and to form differences between signals generated by detection microbridges and signals generated by compensation microbridges under the effect of the applied biasing. Each detection microbridge and each compensation microbridge includes electrically-conductive anchoring nails connected to the read circuit, a membrane attached to the anchoring nails above the substrate, and a thermometric element arranged in the membrane. The detector further includes thermal short-circuit elements between the membrane of each compensation microbridge and the substrate.

7 Claims, 11 Drawing Sheets

(51) Int. Cl.
*H05K 3/00* (2006.01)
*H05K 3/02* (2006.01)

(56) References Cited

U.S. PATENT DOCUMENTS

| | | | |
|---|---|---|---|
| 8,373,123 B2* | 2/2013 | Ouvrier-Buffet | G01J 5/08 250/338.1 |
| 8,455,828 B1* | 6/2013 | Egerton | G01J 1/46 250/339.01 |
| 8,816,283 B2* | 8/2014 | Yon | G01J 5/02 250/338.4 |
| 2004/0200962 A1* | 10/2004 | Ishikawa | G01J 5/02 250/339.04 |
| 2006/0060786 A1* | 3/2006 | Vilain | G01J 5/20 250/338.1 |
| 2006/0231761 A1* | 10/2006 | Peytavit | G01J 5/0837 250/338.1 |
| 2008/0265164 A1* | 10/2008 | Ouvrier-Buffet | G01J 5/20 250/338.4 |
| 2009/0152470 A1* | 6/2009 | Dupont | G01J 5/24 250/340 |
| 2010/0224787 A1* | 9/2010 | Huppertz | G01J 5/22 250/370.15 |
| 2010/0276597 A1* | 11/2010 | Ouvrier-Buffet | G01J 5/08 250/349 |
| 2011/0057107 A1* | 3/2011 | Agnese | G01J 5/08 250/338.3 |
| 2012/0018635 A1* | 1/2012 | Takizawa | G01J 5/08 250/338.3 |
| 2013/0082181 A1* | 4/2013 | Corcos | G01J 5/34 250/349 |
| 2013/0146772 A1* | 6/2013 | N'Guyen | G01J 5/02 250/349 |
| 2013/0240738 A1* | 9/2013 | Yon | G01J 5/02 250/349 |
| 2014/0048708 A1* | 2/2014 | Ouvrier-Buffet | G01J 5/24 250/338.1 |

* cited by examiner

BOLOMETRIC DETECTOR WITH A COMPENSATION BOLOMETER HAVING AN ENHANCED THERMALIZATION

FIELD OF THE INVENTION

The present invention relates to bolometric detectors, and more specifically to bolometric detectors having suspended microbridges associated with one or a plurality of skimming branches comprising compensation bolometers. The invention may particularly be applied in bolometric detection at ambient temperature, infrared radiation detection, especially infrared imaging, terahertz radiation detection, especially terahertz imaging, thermography, and gas detection by measurement of the optical absorption in the infrared spectrum.

BACKGROUND OF THE INVENTION

A resistive bolometric detector usually measures the power of an incident radiation in the infrared range. For this purpose, it comprises an absorbing resistive bolometric element which converts the light flow into a heat flow, which causes a temperature rise of said element with respect to a reference temperature. Such a temperature increase then induces a variation of the electric resistance of the absorbing element, causing voltage or current variations thereacross. Such electric variations form the signal delivered by the sensor.

However, the temperature of the bolometric element usually largely depends on the environment thereof, and especially on the temperature of the substrate which comprises the electronic read circuit. To make the absorbing element as little sensitive as possible to its environment, and thus to increase the detector sensitivity, the bolometric element is generally thermally insulated from the substrate.

FIG. 1 is a simplified perspective view of an elementary state-of-the-art resistive bolometric detector 10 for infrared detection illustrating this thermal insulation principle. Such an elementary detector, usually called "bolometer", or "bolometric microbridge", here in the form of a suspended membrane, is conventionally part of a one- or two-dimensional array of elementary detectors.

Bolometer 10 comprises a thin membrane 12 absorbing the incident radiation, suspended above a substrate—support 14 via two conductive anchoring nails 16 to which it is attached by two thermal insulation arms 18. Membrane 12 usually comprises a layer of electric insulator, such as for example $SiO_2$, SiO, SiN, SiON, ZnS or other, which provides the mechanical stiffness of membrane 12, as well as a metallic electric interconnection layer deposited on the insulating layer.

A thin layer 20 of resistive thermometric material is further deposited at the center of membrane 12 on the metal interconnection layer, especially a layer of semiconductor material, such as p- or n-type polysilicon or amorphous silicon, lightly or strongly resistive, or a vanadium oxide ($V_2O_5$, $VO_2$) processed in a semiconductor phase, or titanium, titanium oxide (TiOx), or nickel oxide (NiOx). Finally, substrate-support 14 comprises an electronic circuit integrated on a silicon wafer, usually known as "read circuit". The read circuit comprises, on the one hand, the elements for stimulating and reading from thermometric element 20 and, on the other hand, the multiplexing components which enable to serialize the signals originating from the different thermometric elements present in the array detector.

In operation, membrane 12 heats up under the effect of an incident electromagnetic radiation and the generated heat power is transmitted to layer 20 of thermometric material. Periodically, the read circuit arranged in substrate 14 biases membrane 12 by submitting nails 16 to a bias voltage and collects the current flowing through thermometric element 20 to deduce a variation of the resistance thereof, and thus the incident radiation having caused said variation.

While the fact of suspending the thermometric element above the substrate enables it to undergo an electric resistance variation under the effect of the incident radiation, such a variation however remains minute. Indeed, in the context of the elementary bolometric detector of FIG. 1, at 300° K, a variation by 1 K of the observed scene induces a relative variation of the electric resistance of thermometric layer 20 by approximately 0.04%. Indeed, most of the value of the electric resistance of this element is mainly dictated by the direct environment of the membrane. Particularly, the substrate influences the temperature of membrane 12 via the thermal conduction through nails 16 and arms 18, which sets approximately 70% of the value of the electric resistance of layer 20. In the best case, less than 10% of the value of the electric resistance, and more generally less than 1% thereof, are set by the incident radiation. The most part of the electric resistance of thermometric material layer 20 being set by elements unrelated to the observed scene, when no specific measures are taken, the detector read dynamic range is thus very limited, which makes such a detector very difficult to use.

To overcome this issue, the elementary bolometric detector is associated with a compensation or skimming structure, aiming at removing the non-useful part of the signal originating from the reading from the thermometric element of the membrane, usually known as "common-mode" signal.

FIG. 2 is an electric diagram of an infrared bolometric detector 200 of the state of the art comprising such a skimming structure. Detector 200 comprises a two-dimensional array 202 of unit detection elements 204, or "pixels", each comprising a sensitive bolometer 206 in the form of a membrane suspended above a substrate, for example, the bolometer illustrated in FIG. 1, connected at one of its terminals to a constant voltage "$V_{DET}$" and at the other terminal to a MOS biasing transistor 208 setting the voltage across bolometer 206 by means of a gate control voltage "$G_{DET}$". Pixel 204 also comprises a selection switch 210, connected between MOS transistor 208 and a node "A" provided for each column of array 202, and driven by a control signal "SELECT", enabling to select bolometer 206 for the reading therefrom. The two-dimensional assembly of suspended membranes, usually called "retina", is placed in a tight package in line with a window transparent to the infrared radiation to be detected and in the focal plane of an optical system (not shown). Transistor 208 and switch 210 are usually formed in the substrate under control of the membrane of bolometer 206.

Detector 200 also comprises, at the foot of each column of array 202, a skimming structure 212 comprising a compensation bolometer 214 identical to bolometers 206 of pixels 204 from an electrothermal viewpoint and made insensitive to the incident radiation originating from the scene to be observed by being "thermalized" to substrate 14. The electric resistance of bolometer 214 is thus essentially dictated by the temperature of substrate 14.

Bolometer 214 is further connected at one of its terminals to a constant voltage "$V_{SKIM}$", and skimming structure 212 further comprises a biasing MOS transistor 218 setting the voltage across bolometer 214 by means of a gate control voltage "$G_{SKIM}$" and connected between the other terminal of bolometer 214 and node "A".

Detector 200 also comprises, at the foot of each column of array 202, an integrator 220 of CTIA type ("capacitive transimpedance amplifier") for example comprising an amplifier 222 and a capacitance 224 connected between the inverting input and the output of amplifier 222. The inverting terminal and the non-inverting terminal thereof are further respectively connected to node "A" and to a constant voltage "VBUS". A switch 226, driven by a signal "RAZ", is also provided in parallel with capacitance 224, for the discharge thereof. The outputs of CTIAs 220 are eventually, for example, connected to respective sample-and-hold devices 228 for the delivery of voltages "Vout" of the CTIAs in multiplexed mode.

Finally, detector 200 comprises a management unit 230 controlling the different previously-described switches. In operation, array 202 is read from line by line. To read from a row of array 202, switches 210 of the line of pixels 204 are turned on and switches 210 of the other lines are turned off. After a phase of discharge of the CTIA capacitors at the foot of the columns, achieved by the turning-on of switches 226 followed by their turning-off, a circuit such as shown in FIG. 3 is thus obtained for each pixel of the line being read. A current "Iop" flows in bolometer 206 of the pixel under the effect of its voltage biasing by MOS transistor 208, and a current "Is" flows in bolometer 214 of the skimming structure under the effect of its voltage biasing by MOS transistor 218. The resulting current difference is integrated by CTIA 220 for a predetermined integration period "Tint". Output voltage "Vout" of CTIA 220 thus is a measurement of the variation of the resistance of bolometer 206 caused by the incident radiation to be detected since the non-useful part of current "Iop", that is, the substrate temperature, and thus the ambient temperature, is at least partly compensated for by current "Is" specifically generated to reproduce this non-useful part. Since the substrate temperature is compensated for, it may freely vary and it is thus not needed to provide devices for controlling the substrate temperature, particularly a Peltier cooler.

According to a first specific design of the state of the art, compensation bolometer 214 comprises a stack identical to the stack forming the suspended portion of the membrane of bolometers 206, and thus the suspended membrane of bolometers 206 without the thermal insulation system essentially comprising thermal insulation arms 18, directly formed on top and/or inside of substrate 14. This first configuration however requires a design different from that of sensitive bolometers, which complicates the detector manufacturing.

According to a second specific configuration of the state of the art, compensation bolometer 214 comprises all the elements forming sensitive bolometers 206 of array 202. The membrane of bolometer 214 is thermalized to the substrate by elements having a low thermal resistance, for example, metal elements, rigidly attached to the membrane and to the substrate and arranged at the membrane periphery. These elements thus form thermal short-circuits between the membrane and the substrate so that these elements have the same temperature.

FIGS. 4A and 4B respectively are cross-section views of a sensitive bolometer and of a compensation bolometer of the state of the art, for example, of the type described in relation with FIG. 1, the cross-section views corresponding to cross-section plane IV-IV of FIG. 1. As can be observed, compensation bolometer 214 differs from sensitive bolometer 206 in that it comprises two metal elements 300 arranged on either side of bolometer membrane 12 at the periphery thereof. Such a configuration enables to manufacture compensation bolometer 214 substantially identically to the manufacturing of sensitive bolometer 206, except for elements 300. Due to elements 300, the detector manufacturing is thus simpler and less expensive but the manufacturing of the compensation bolometer however remains complex.

Although the skimming structure just described provides satisfactory results, it can however be observed that the thermalization of compensation bolometers 214 to the substrate is insufficient to exactly compensate for the temperature thereof. Further, thermal short-circuits 300 being formed at the periphery of membrane 12 of compensation bolometers 214, the latter require additional technological manufacturing steps and are more bulky than sensitive bolometers 206, which adversely affects the miniaturization and/or the filling factor of compensation bolometers.

It should be noted that this issue arises whatever the type of circuit used to bias and "read" from the array of sensitive bolometers. In the previously-described state of the art, a voltage biasing is considered. The issue also arises in current-biased detectors, the read signal then being a difference between the voltages across sensitive bolometers and the voltages across compensation bolometers.

Similarly, this issue arises whatever the number of compensation bolometers provided in the detector. Particularly, one compensation bolometer may be provided for each sensitive bolometer. Also, a compensation bolometer may be formed by the series connection of unit compensation bolometers of the type just described in order to decrease, for example, the column noise. The same issue thus arises.

SUMMARY OF THE INVENTION

The present invention aims at providing a bolometric detector comprising compensation bolometers based on suspended membranes having an increased thermalization to the substrate.

For this purpose, the invention aims at a bolometric detector comprising:
a substrate;
bolometric detection microbridges suspended above the substrate and thermally insulated from the substrate;
bolometric compensation microbridges suspended above the substrate and thermalized to the substrate; and
a read circuit formed in the substrate to apply a biasing to the detection microbridges and to the compensation microbridges and to form differences between signals generated by detection microbridges and signals generated by compensation microbridges under the effect of the applied biasing.

In the detector, each detection microbridge and each compensation microbridge comprises electrically-conductive anchoring nails connected to the read circuit, a membrane attached to the anchoring nails above the substrate and a thermometric element arranged in the membrane, and the detector further comprises thermal short-circuit elements between the membrane of each compensation microbridge and the substrate According to the invention, the thermal short-circuit elements under each compensation microbridge comprise metal patterns arranged under the bolometric element of each compensation microbridge and in contact with the membrane of the compensation microbridge and of the substrate.

In other words, the volume existing between the membrane and the substrate is used to house thermal connections between the two elements. Not only are the connections arranged at closest to the thermometric element to be thermalized, but it is further possible to provide a significant number of thermal short-circuits. An increase thermalization is thus obtained. Further, the thermalization may be obtained by means of these short-circuits alone, without using short-circuit elements at the membrane periphery. The compensation bolometers can thus have a decreased bulk. Eventually, the manufacturing of compensation bolometers can be simplified by manufacturing the short-circuit elements identically to the anchoring nails suspending the membranes of the detection and compensation microbridges.

According to an embodiment, the membranes of the compensation microbridges are identical to the membranes of the detection microbridges. Particular, the compensation microbridges are identical to the detection microbridges.

According to an embodiment, the metal patterns are identical to the anchoring nails suspending the membrane of the compensation microbridge.

According to an embodiment, the metal patterns are electrically insulated from the thermometric element of the compensation microbridge.

According to an embodiment, the metal patterns substantially are cylinders having a circular cross-section with a diameter in the range from 0.25 micrometer to 5 micrometers.

According to an embodiment, the number of metal patterns is in the range from 0.5 to 1.5 patterns per $\mu m^2$, particularly 1 pattern per $\mu m^2$. Particularly, with cylindrical patterns having a diameter in the range from 0.5 $\mu m$ to 5 $\mu m$, the number of patterns for a membrane of $10 \times 10$ $\mu m^2$ is in the range from 1 to 100.

The invention also aims at a method of manufacturing a detector of the above-mentioned type, comprising:
    forming the substrate and the read circuit, the read circuit comprising metal pads at the locations provided for the anchoring nails of the detection microbridges and of the compensation microbridges;
    depositing, on the surface of the substrate, a sacrificial layer;
    forming through holes in the sacrificial layer at the locations provided for the anchoring nails and for the thermal short-circuit patterns;
    metallizing the through holes;
    forming the membranes of the detection microbridges and of the compensation microbridges on the sacrificial layer; and
    removing the sacrificial layer.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE INVENTION

Figure 1:
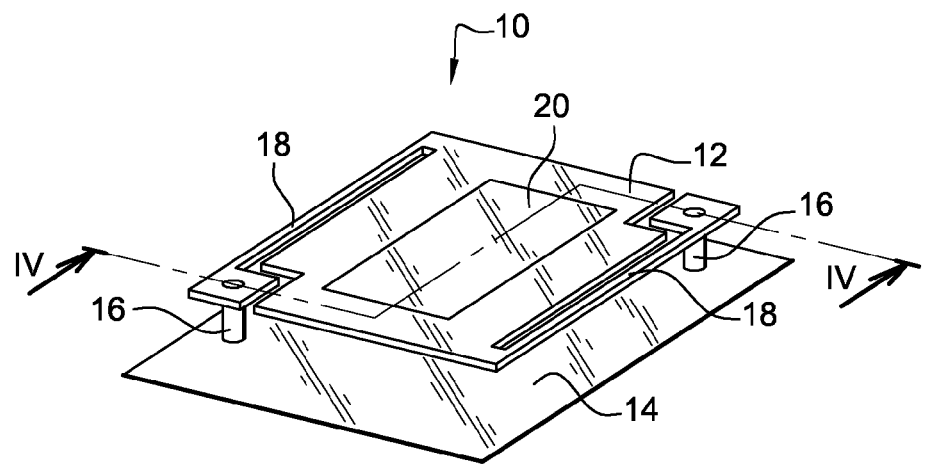
FIG. 1 is a simplified perspective view of an elementary bolometric detector of the state of the art, already described hereabove.
Figure 3:
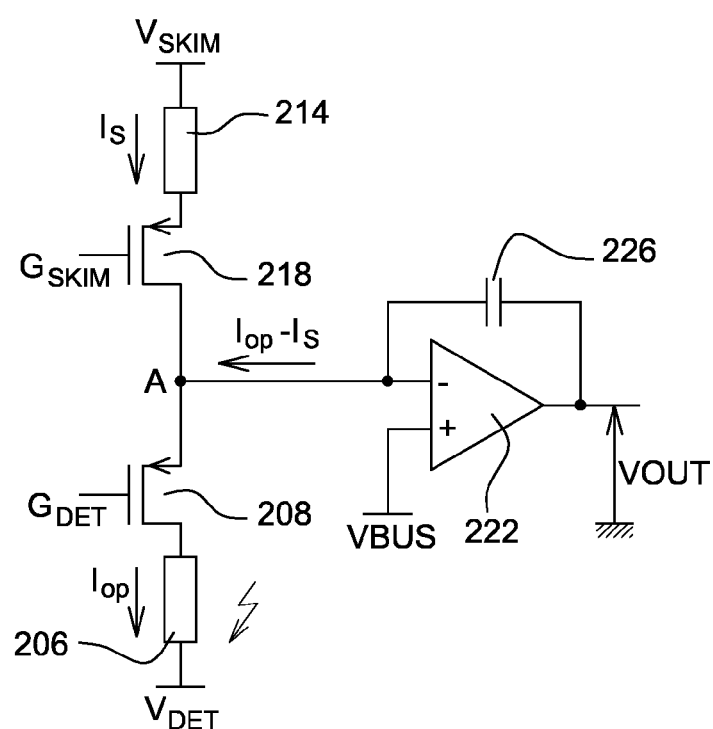
FIG. 3 is an electric diagram illustrating the reading from a sensitive bolometer of the detector of FIG. 2 by means of a skimming structure.
Figure 2:
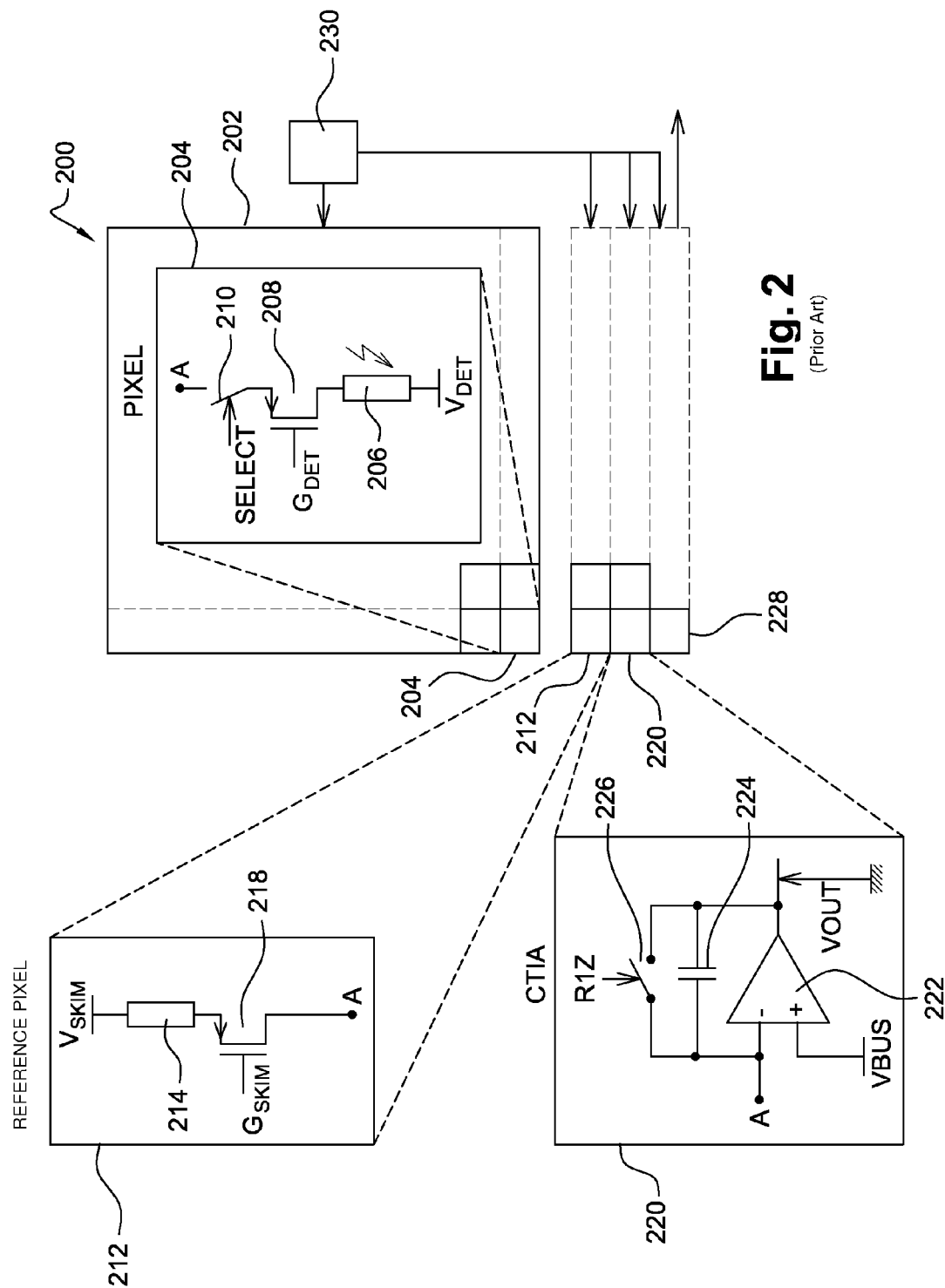
FIG. 2 is an electric diagram of an infrared bolometric detector of the state of the art, already described hereabove.
Figure 4A:
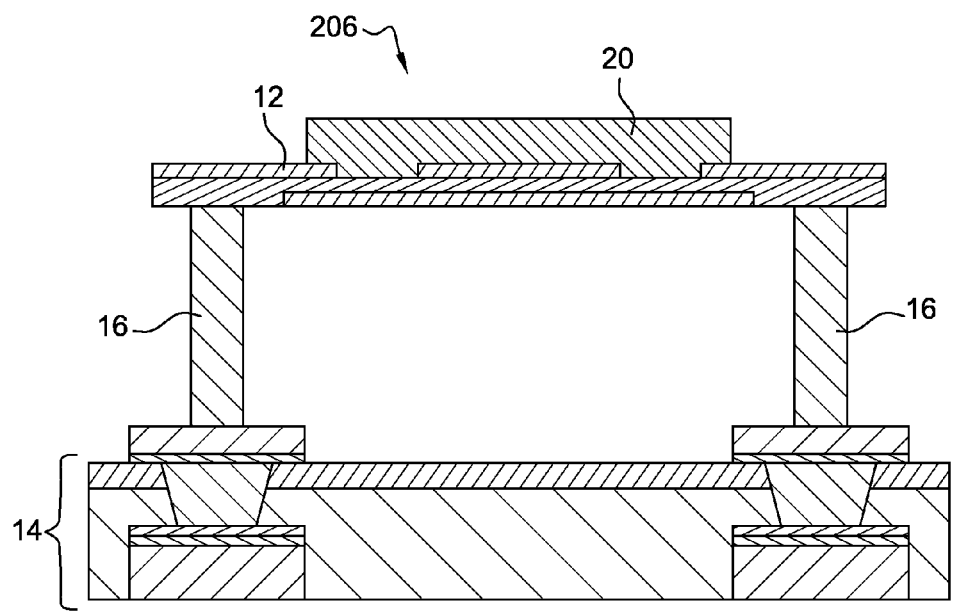
FIGS. 4A and 4B are simplified cross-section views along plane IV-IV of FIG. 1 respectively of a sensitive bolometer and of a compensation bolometer of the state of the art.
Figure 4B:
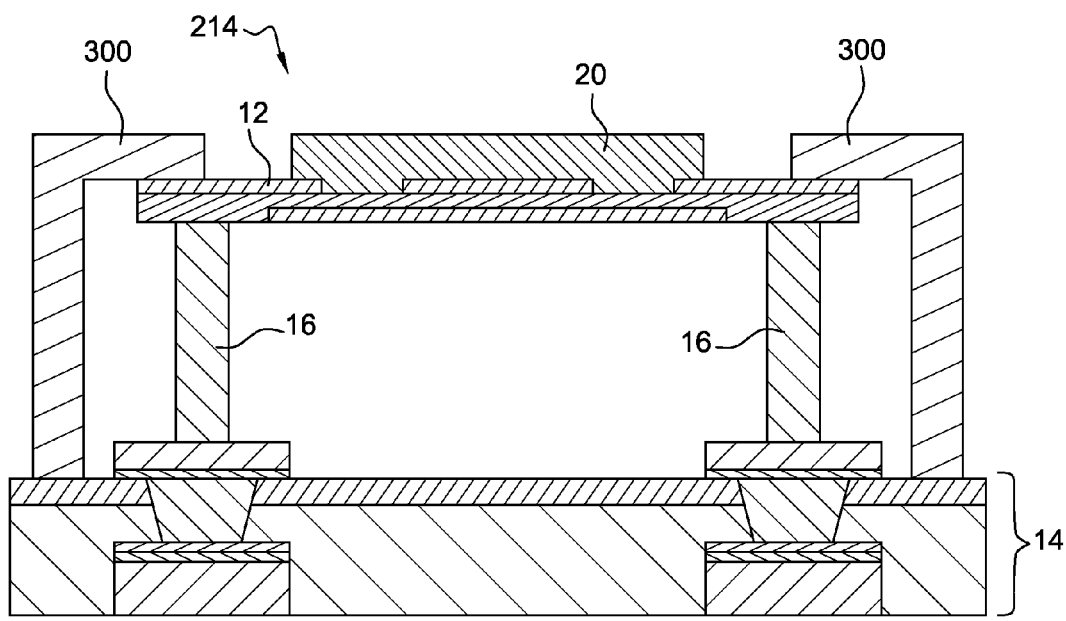

A method of manufacturing a compensation bolometer 214 according to the invention, forming part of a bolometric detector, for example, a detector of the type described in relation with FIGS. 1 to 3, will now be described in relation with FIGS. 5 to 8.

Figure 5:
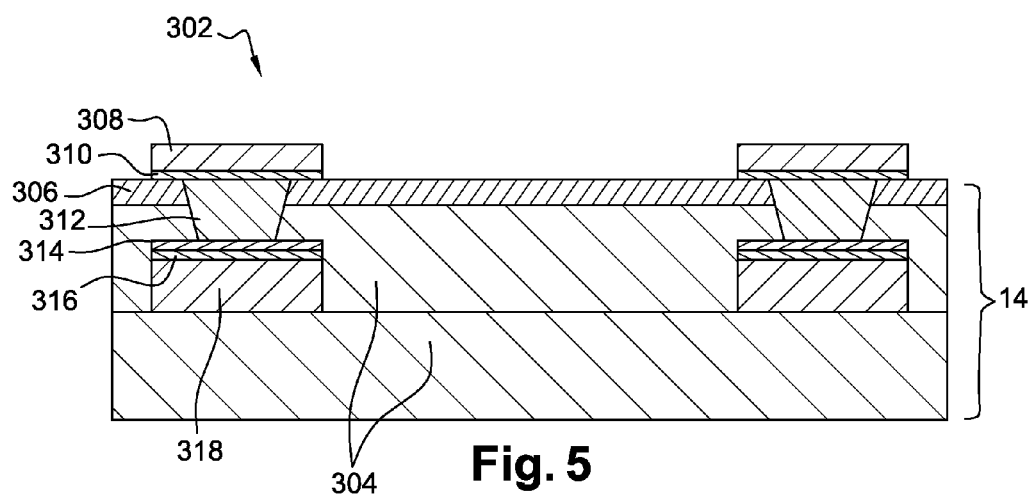
FIGS. 5 to 17 are simplified cross-section views along plane IV-IV of a method of manufacturing a compensation bolometer according to the invention.

The method starts with the manufacturing of a substrate 14 and of a read circuit 302 of the detector, as known per se in the state of the art (FIG. 5). For example, substrate 14 comprises a silicon layer integrating CMOS circuits for the performing of the read functions (not shown), for example, the components and circuits illustrated in FIG. 2 for biasing and reading bolometers 206, 214, said layer having a dielectric layer 304, for example, made of silicon oxide ($SiO_2$), covered with a silicon nitride layer ($Si_xN_y$) 306, formed thereon. Dielectric layer 304 integrates the upper interconnection level of read circuit 302. This interconnection level comprises connection areas 308, 310 at the locations provided for anchoring nails 16 of the sensitive bolometers and of the compensation bolometers, metal vias 312, and lower interconnection areas 314, 316, 318 connected to areas 306, 308 at the surface of substrate 14 by vias 312.

Different technical options may be implemented to interconnect areas of different levels. A first option comprises using metal areas 308, 318 made of an aluminum layer, advantageously covered on their opposite surfaces with one or two titanium or titanium nitride layers 310, 314, 316, and using a tungsten via 310. According to another option, via 310 is made with copper according to a known manufacturing method, called damascene, which comprises filling trenches of a dielectric 304 with copper.

Figure 6:
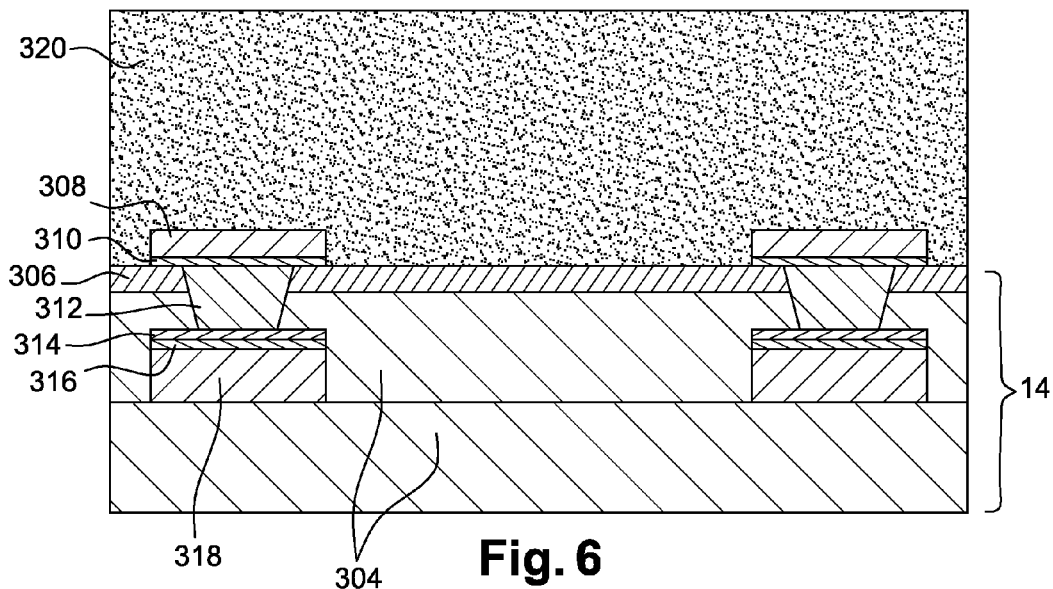

In a next step of the method, a sacrificial layer 320 is deposited on substrate 14 and interconnection areas 308, said layer being advantageously made of an organic polymer such as polyimide or benzocyclobutene (BCB) or made of a mineral silicon oxide or silicon layer (FIG. 6). Organic layer 320 is for example deposited by spin coating and undergoes after its deposition a thermal crosslinking treatment to be thermally stabilized. The thickness of sacrificial layer 320 depends on the height desired between the membranes of the sensitive bolometers and of the compensation bolometers and the substrate, such a height being usually in the range from 1 micrometer to 5 micrometers. The thickness of organic sacrificial layer 320 can easily be set by adjusting the rotation speed of the spin coating deposition.

Once sacrificial layer 320 has been deposited, through holes 322 are formed across the total thickness of layer 320 above areas 308 for the sensitive bolometers and the compensation bolometers.

Figure 7:
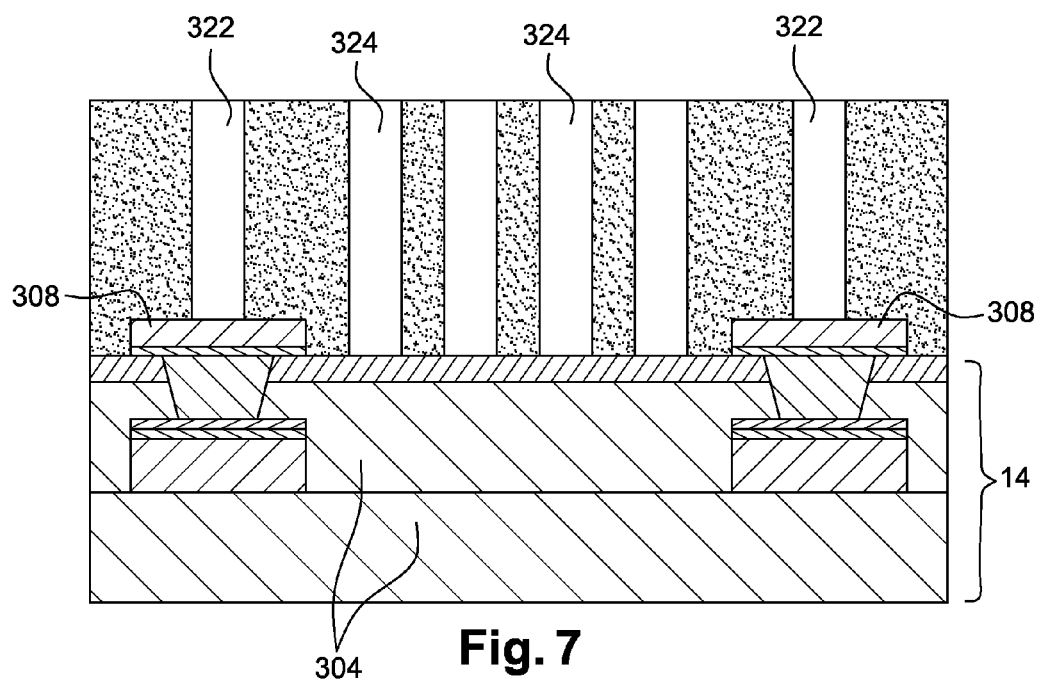

For the compensation bolometers, additional through holes 324 are formed across the total thickness of layer 320 at locations provided for the subsequent forming of thermal short-circuit elements, that is, under the membranes of the compensation bolometers subsequently formed on sacrificial layer 320, as discussed hereafter (FIG. 7). Holes 322, 324 are advantageously jointly formed by means of the same technique, particularly photolithography. These holes for example take the shape of cylindrical holes having a circular cross-section with a diameter in the range from 0.25 micrometer to 5 micrometer.

Figure 8:
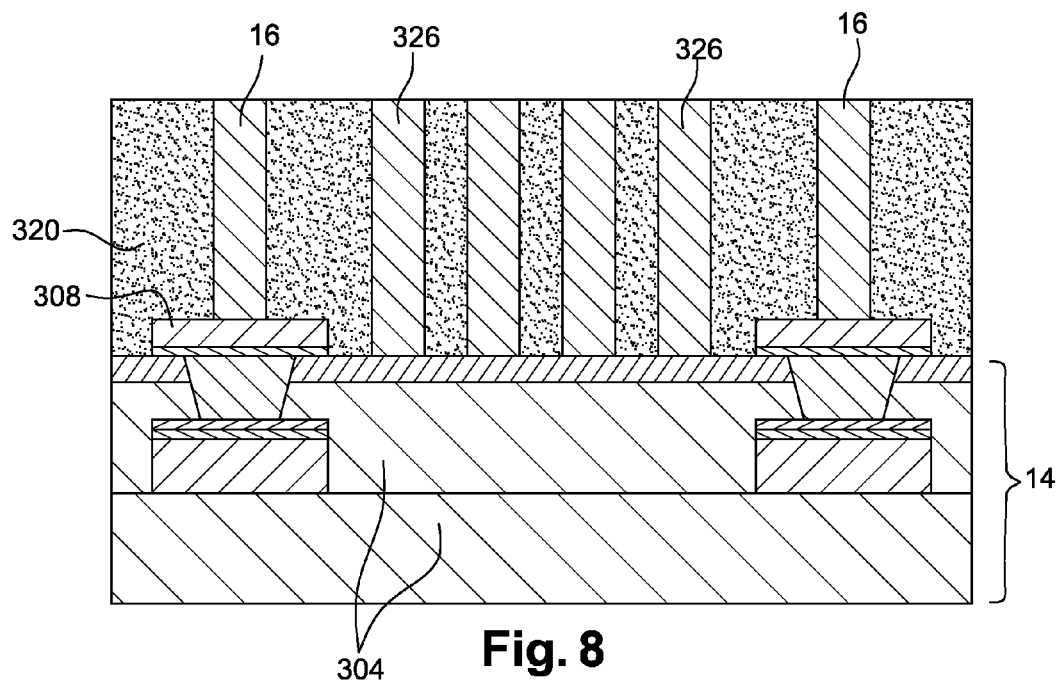

Holes 322, 324 are then metallized, for example, filled with tungsten and/or with copper by means of a damascene-type method (FIG. 8). Anchoring nails 16 of the sensitive bolometers and of the compensation bolometers, as well as an assembly of thermal short-circuit elements 326 towards substrate 14 of the compensation bolometers, are manufactured.

Figure 9:
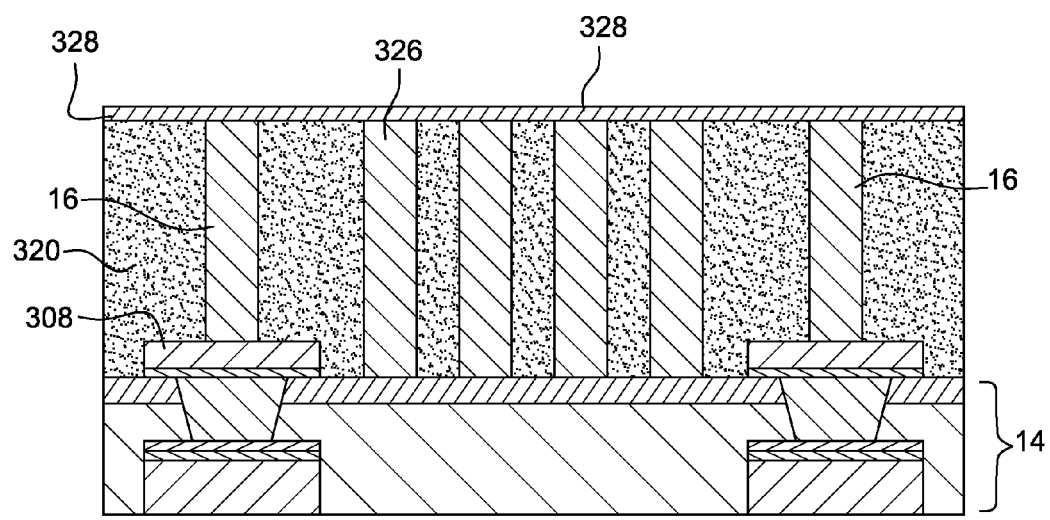

The method then carries on with the deposition of a dielectric layer 328 on sacrificial layer 320, at least at the locations provided for the membranes of the compensation bolometers and advantageously also at the locations provided for the membranes of the sensitive bolometers, to obtain identical membranes for the two bolometer types (FIG. 9). Layer 328 is for example deposited all over sacrificial layer 320. Dielectric layer 328, for example, made of SiN, SiON, Si, or SiO₂, has the function of electrically insulating the membranes of the compensation bolometers from thermal short-circuit elements 326.

Figure 10:
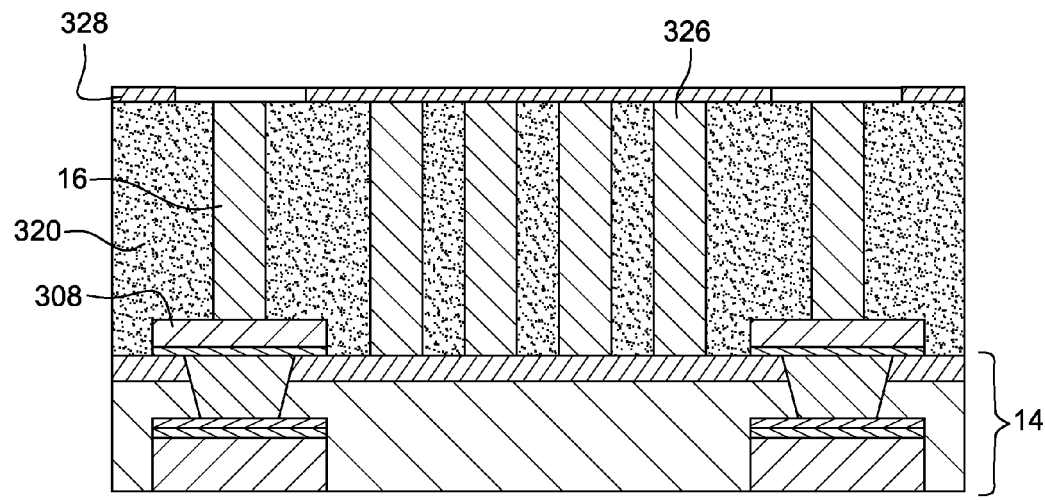

Dielectric layer 326 is then etched above anchoring nails 16 in order to expose them (FIG. 10).

The manufacturing of membrane 12 of the detection and compensation bolometers then carries on conventionally.

Figure 11:
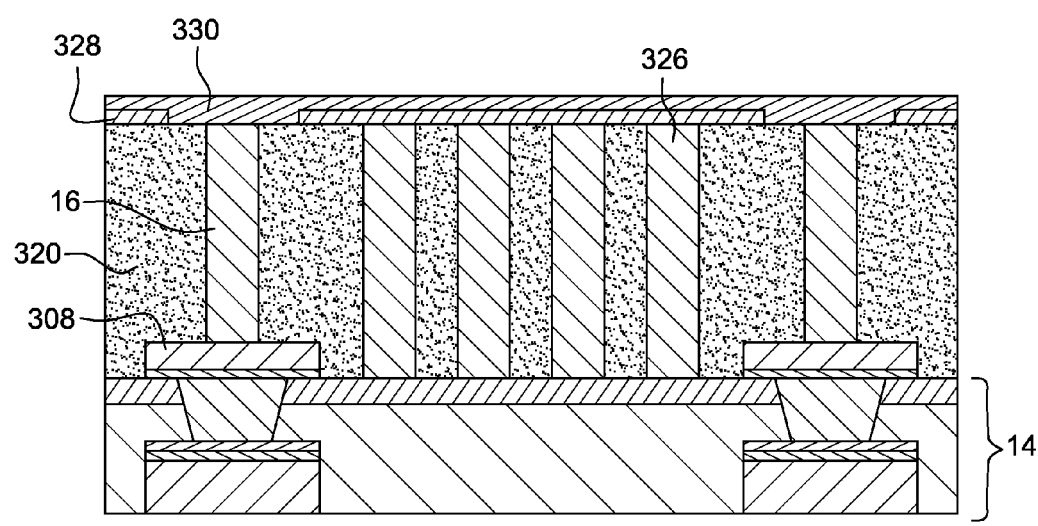

For example, a layer 330 of a material absorbing the radiation to be detected is deposited on dielectric layer 328 and exposed anchoring nails 16 (FIG. 11). Absorbing layer 330 is also electrically conductive to enable to apply an electric biasing through nails 16. For example, absorbing layer 330 is made of titanium (Ti), of titanium nitride (TiN), of titanium tungsten (TiW), of ammonium nitrate (TaN), or of tungsten nitrate (WN).

Figure 12:
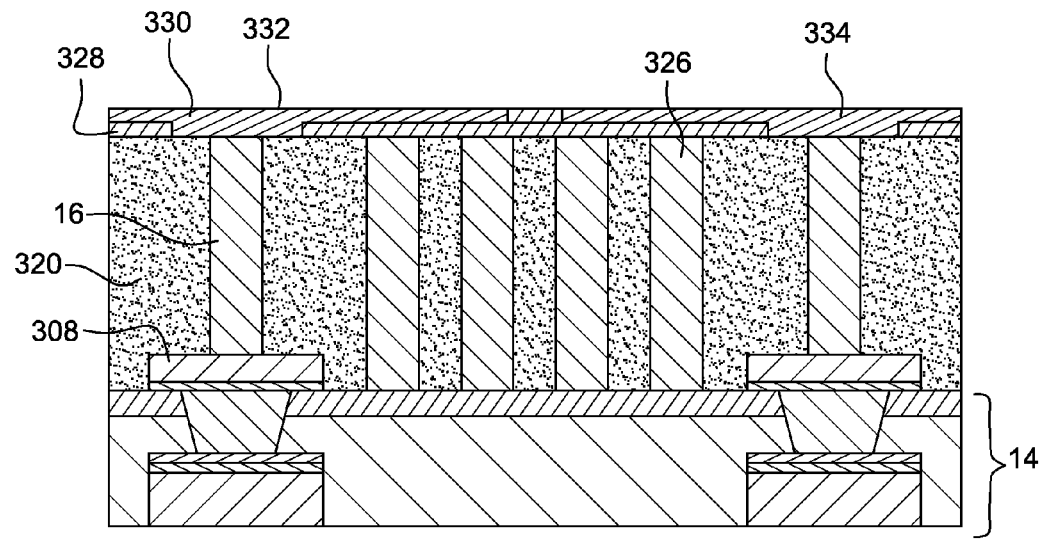
Figure 13:
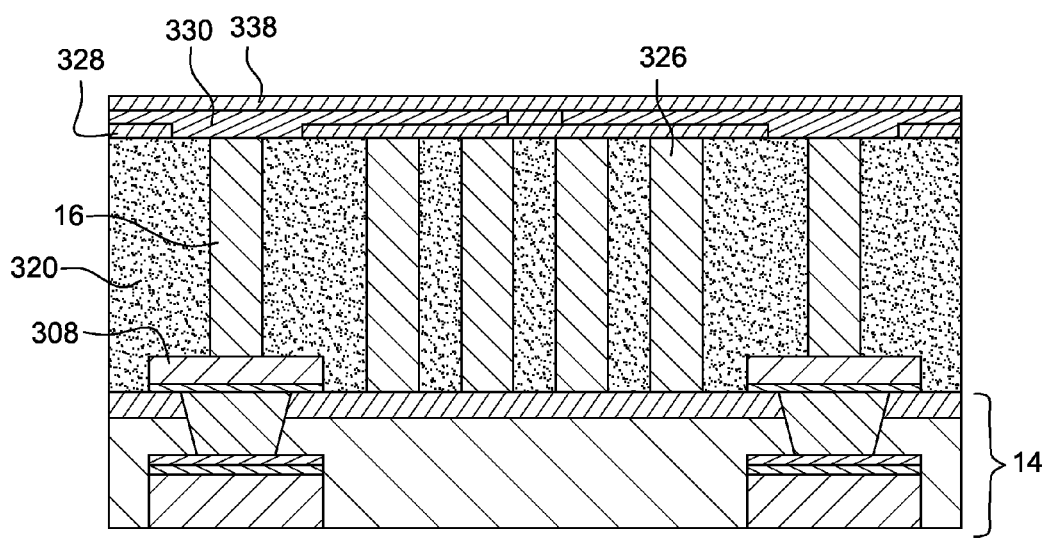
Figure 14:
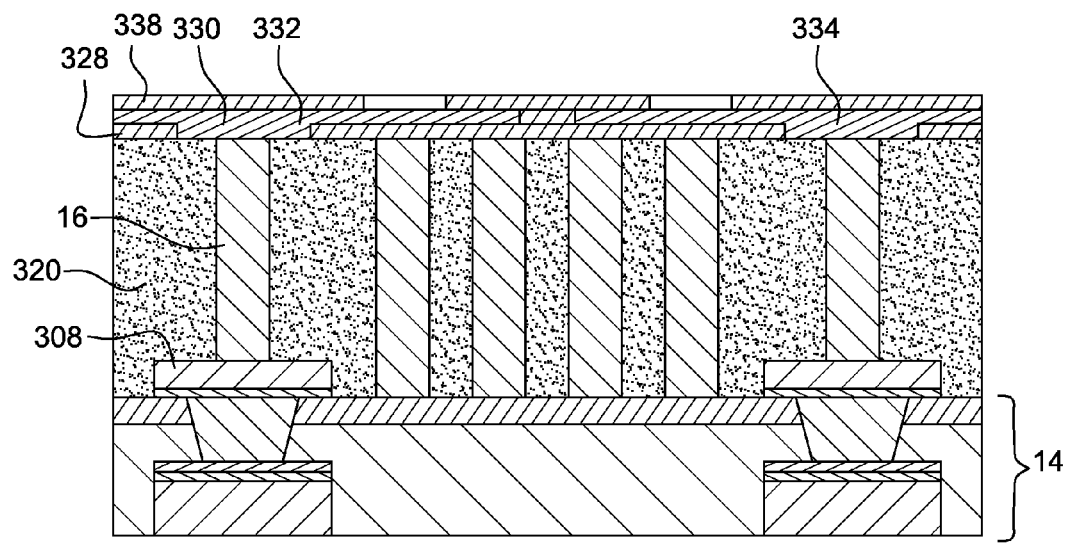
Figure 15:
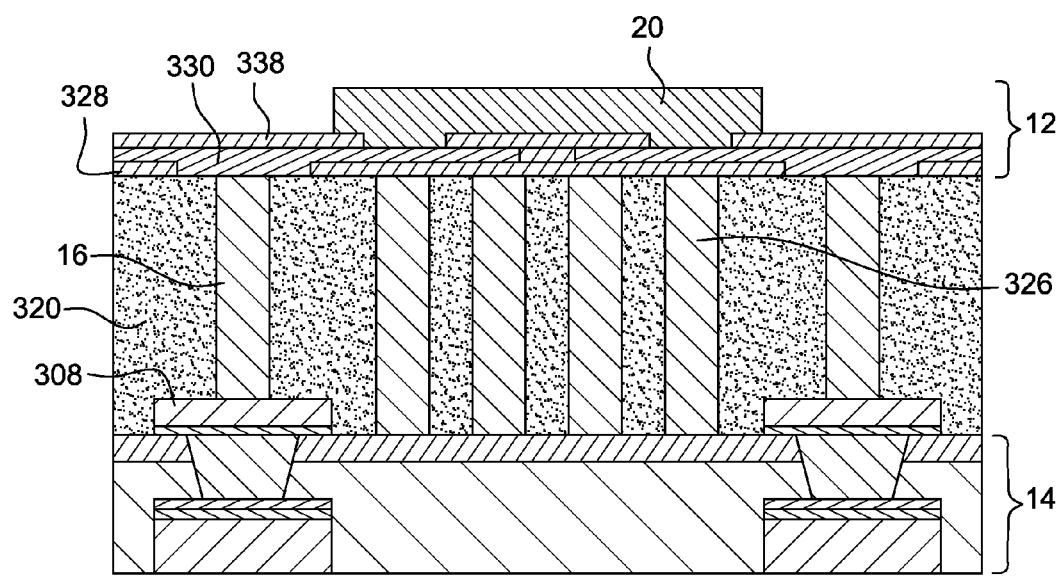

Layer 330 is then etched to define two different patterns 332, 334 used as electrodes for biasing the subsequently-deposited thermometric material (FIG. 12). A second dielectric layer 338, for example having a composition identical to that of dielectric layer 328, is then deposited on absorbing layer 330 (FIG. 13) and layer 338 is etched to define two opening towards absorbing layer 330 so that the two electrodes 332, 334 will be electrically insulated once the element made of thermometric material has been deposited (FIG. 14). Element 20 made of thermometric material, for example, made of amorphous silicon or of vanadium oxide, is then deposited on dielectric layer 338 to fill the openings towards layer 330, thus completing the technological stacking of membrane 12 of the bolometers (FIG. 15).

Figure 16:
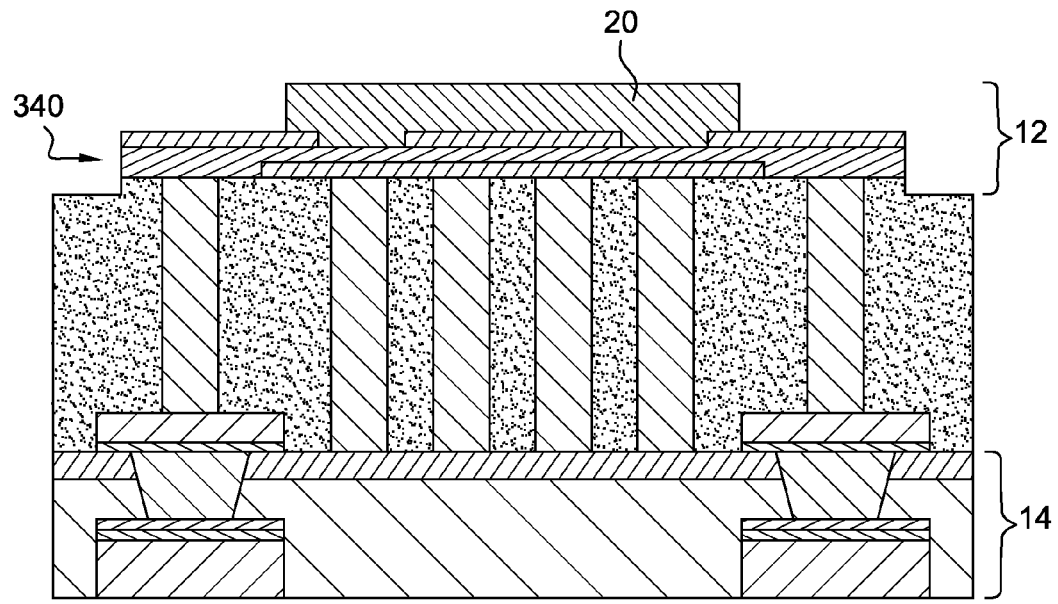
Figure 17:
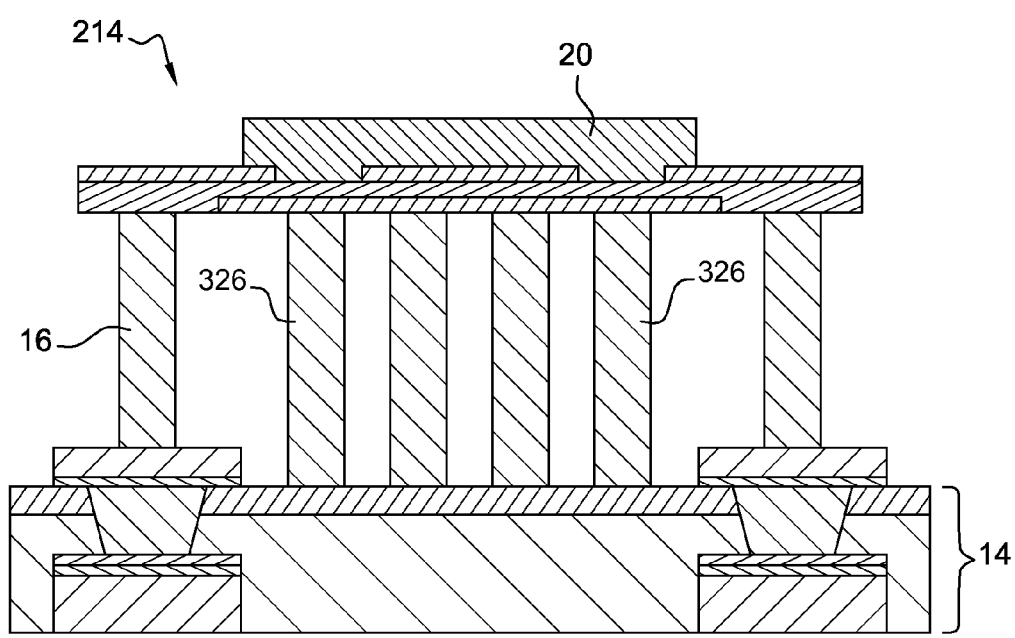

The membranes are then individualized by etching of trenches 340 in the stack of membranes 12 (FIG. 16) and sacrificial layer 320 is removed, thus disengaging membranes 12 of the bolometers (FIG. 17).

Compensation bolometers which are structurally identical to sensitive bolometers but have a different thermal connection with the substrate due to the presence of thermal short-circuit elements 326 are thus obtained. Thus, the membranes of compensation bolometers and the membranes of sensitive bolometers are identical, and thus have the same optical and electrical properties. This not only simplifies the bolometric detector manufacturing method, but also implies a more accurate common-mode compensation.

It should also be noted that short-circuit elements 326 are electrically insulated from layer 20 of thermometric material by a dielectric layer 328, so that the electric resistance of this layer is not modified by the presence of short-circuit elements 326.

Figure 18:
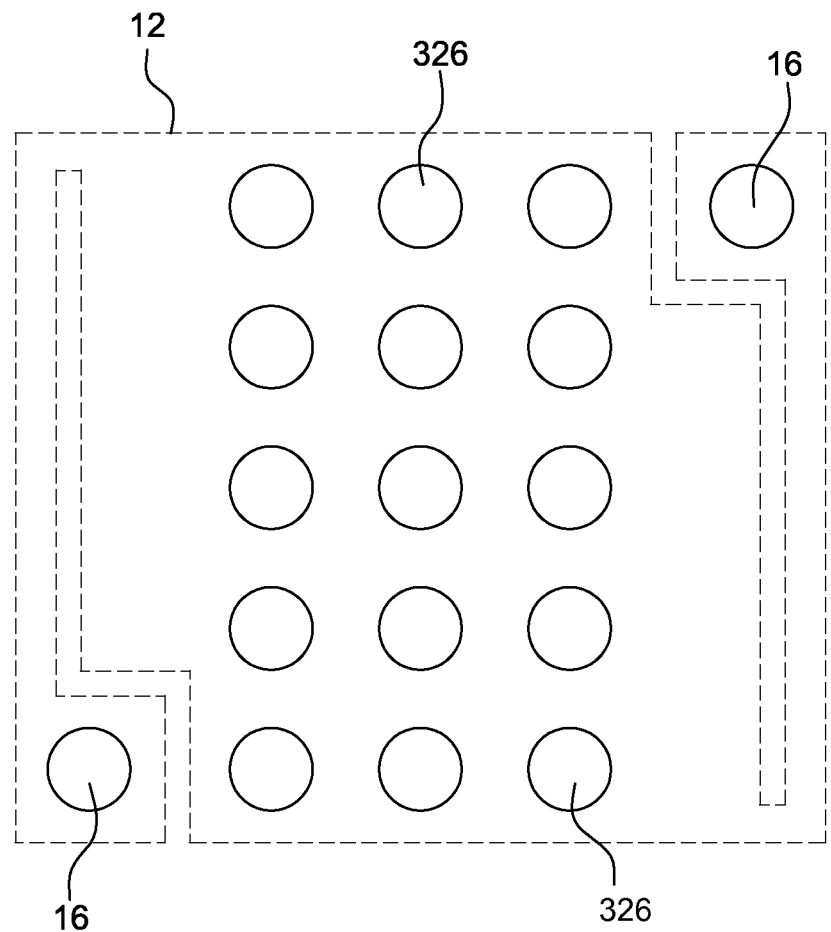
FIG. 18 is a simplified top view of a compensation bolometer provided with short-circuit elements according to the invention.

FIG. 18 illustrates, for a compensation bolometer, an example of anchoring nails 16 and thermal short-circuit elements 326 in top view, membrane 12 being illustrated in dotted lines. As can be observed, a significant quantity of elements 326 can be formed under membrane 12, for example, in the form of an array of elements regularly spaced apart to obtain a homogeneous thermalization of membrane 12. Advantageously, a maximum number of short-circuit elements per surface area unit is provided, which enables to optimally thermalize membrane 12.

Of course, other embodiments are possible, particularly as concerns the shape and the composition of the membranes of detection and compensation bolometers.

Particular, compensation bolometers comprise a membrane identical to that of sensitive bolometers, which is directly attached to said anchoring nails, without the presence of thermal insulation arms, an additional thermalization of the membrane to the substrate being thus obtained via the anchoring nails. As a variation, the membrane of compensation bolometers is attached to said nails via arms shorter than those of sensitive bolometers, which results in increasing the thermalization to the substrate of compensation bolometers.

What is claimed is:

1. A bolometric detector comprising:
   a substrate;
   bolometric detection microbridges suspended above the substrate and thermally insulated from the substrate;
   bolometric compensation microbridges suspended above the substrate and thermalized to the substrate; and
   a read circuit formed in the substrate to apply a biasing to the detection microbridges and to the compensation microbridges and to form differences between signals generated by detection microbridges and signals generated by compensation microbridges under the effect of the applied biasing,
   each detection microbridge and each compensation microbridge comprising electrically-conductive anchoring nails connected to the read circuit, a membrane attached to the anchoring nails above the substrate, and a thermometric element arranged in the membrane;
   the bolometric detector further comprising thermal short-circuit elements between the membrane of each compensation microbridge and the substrate,
   wherein the thermal short-circuit elements under each compensation microbridge comprise metal patterns arranged under the bolometric element of the compensation microbridge and in contact with the membrane of the compensation microbridge and of the substrate and wherein the short-circuit elements are electrically insulated from the thermometric element by a dielectric layer.

2. The bolometric detector of claim 1, wherein the membranes of the compensation microbridges are identical to the membranes of the detection microbridges.

3. The bolometric detector of claim 1, wherein the metal patterns are identical to the anchoring nails suspending the membrane of the compensation microbridge.

4. The detector of claim 1, wherein the metal patterns are electrically insulated from the thermometric element of the compensation microbridge.

5. The bolometric detector of claim 1, wherein the metal patterns are substantially cylinders having a circular cross-section with a diameter in the range from 0.25 micrometer to 5 micrometers.

6. The bolometric detector of claim 1, wherein the number of metal patterns is in the range from 0.5 to 1.5 per $\mu m^2$.

7. A method of manufacturing the bolometric detector of claim 1, wherein the method comprises the steps of:
- forming the substrate and the read circuit, the read circuit comprising metal pads at locations provided for the anchoring nails of the detection microbridges and of the compensation microbridges;
- depositing on the surface of the substrate a sacrificial layer;
- forming through holes in the sacrificial layer at the locations provided for the anchoring nails and for the thermal short-circuit patterns;
- metallizing the through holes;
- forming the membranes of the detection microbridges and of the compensation microbridges on the sacrificial layer; and
- removing the sacrificial layer.

* * * * *